United States Patent
Khachatryan et al.

(10) Patent No.: US 9,118,037 B2
(45) Date of Patent: Aug. 25, 2015

(54) METHOD OF MANUFACTURING FLEXIBLE SUBSTRATE AND METHOD OF MANUFACTURING DISPLAY DEVICE USING THE SAME

(71) Applicant: Samsung Display Co., Ltd., Yongin (KR)

(72) Inventors: Hayk Khachatryan, Hwaseong-si (KR); Hyunwoo Koo, Hwaseong-si (KR); Sunho Kim, Seongnam-si (KR); Taewoong Kim, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/451,705

(22) Filed: Aug. 5, 2014

(65) Prior Publication Data

US 2015/0188097 A1    Jul. 2, 2015

(30) Foreign Application Priority Data

Dec. 30, 2013    (KR) .................. 10-2013-0167183

(51) Int. Cl.
  H01L 21/30    (2006.01)
  H01L 21/46    (2006.01)
  H01L 51/56    (2006.01)
  H01L 51/00    (2006.01)
  G02F 1/1333    (2006.01)

(52) U.S. Cl.
  CPC .......... H01L 51/56 (2013.01); G02F 1/133305 (2013.01); H01L 51/003 (2013.01); H01L 51/0097 (2013.01); H01L 2251/5338 (2013.01)

(58) Field of Classification Search
  USPC ........................................ 438/458
  See application file for complete search history.

(56) References Cited

U.S. PATENT DOCUMENTS

| | | | |
|---|---|---|---|
| 5,232,860 A | 8/1993 | Kawanishi et al. | |
| 5,262,347 A | 11/1993 | Sands | |
| 5,665,802 A | 9/1997 | Maki et al. | |
| 7,622,367 B1 | 11/2009 | Nuzzo et al. | |
| 7,842,547 B2 | 11/2010 | Shelton et al. | |
| 8,142,593 B2 | 3/2012 | Deguet et al. | |
| 8,216,876 B2 | 7/2012 | Yasumatsu | |
| 2008/0075927 A1* | 3/2008 | Sakashita ................. | 428/172 |

(Continued)

FOREIGN PATENT DOCUMENTS

| | | |
|---|---|---|
| KR | 10-2012-0073904 | 7/2012 |
| KR | 10-2012-0100274 | 9/2012 |
| TW | I343636 | 6/2011 |

OTHER PUBLICATIONS

Satoshi Inoue, et al., "Surface-Free Technology by Laser Annealing (SUFTLA) and Its Application to Poly-Si TFT-LCDs on Plastic Film With Integrated Drivers," IEEE Transactions on Electron Devices, vol. 49, No. 8, pp. 1353-1360, Aug. 7, 2002.

(Continued)

Primary Examiner — Asok K Sarkar
(74) Attorney, Agent, or Firm — H.C. Park & Associates, PLC (57) ABSTRACT

A sacrificial layer is formed on a support substrate and a flexible substrate is formed on the sacrificial layer. Pixels are then formed on the flexible substrate. The sacrificial layer is heated by microwave energy, and a gas is discharged from the sacrificial layer. The flexible substrate, including the pixels formed thereon, is separated from the support substrate including the sacrificial layer formed thereon using the gas.

20 Claims, 6 Drawing Sheets

(56) References Cited

U.S. PATENT DOCUMENTS

| | | |
|---|---|---|
| 2010/0062188 A1 | 3/2010 | Miyamoto et al. |
| 2012/0323059 A1 | 12/2012 | Liu et al. |
| 2013/0011651 A1 | 1/2013 | Iizumi et al. |

OTHER PUBLICATIONS

German Flat Panel Display Forum, "European Technology: Flat Panel Displays," "OLEDs, Flexible Displays and Future," 6th edition, pp. 1-71, www.displayforum.de, Nov. 2008.

Jesmin Haq, et al., "Temporary bond-debond technology for high-performance transistors on flexible substrates," Journal of the SID, vol. 18, Issue 11, Society for Information Display, pp. 884-891, Nov. 2010.

W.S. Wong, et al., "Damage-free separation of GaN thin films from sapphire substrates," Appl. Phys. Lett., vol. 72, Issue 5, American Institute of Physics, p. 599, Feb. 2, 1998.

W.S. Wong, et al., "Selective UV Laser Processing for Lift-off of GaN Thin Films from Sapphire Substrates," Proceedings of the Symposium on LED for Optoelectronic Applications and the 28th State of the Art Programs on Compound Semiconductors, The Electrochemical Society Proceedings, vol. 98-2, 377, pp. 3-8, 1998.

Ian French, et al., "58.4: Invited Paper: Flexible Displays and Electronics Made in AM-LCD Facilities by the EPLaR™ Process," SID 07 Digest, Society for Information Display, vol. 38, Issue 1, pp. 1680-1683, May 2007.

Varun Ratta, "Crystallization, Morphology, Thermal Stability and Adhesive Properties of Novel High Performance Semicrystalline Polyimides," "Semi-Flexible Semicrystalline Polyimides—Literature Review," Chapter 3, pp. 80-101, Chemical Engineering Department of Virginia Tech., Thesis Defended on Apr. 26, 1999, available at http://scholar.lib.vt.edu/theses/available/etd-051799-162256/.

Varun Ratta, "Crystallization, Morphology, Thermal Stability and Adhesive Properties of Novel High Performance Semicrystalline Polyimides," "Polyimides: chemistry & structure-property relationships—literature review," Chapter 1, pp. 3-26, Chemical Engineering Department of Virginia Tech., Thesis Defended on Apr. 26, 1999, available at http://scholar.lib.vt.edu/theses/available/etd-051799-162256/.

"Fifth International Symposium on Polyimides and Other High-Temperature Polymers," Synthesis, Characterization and Applications, Nov. 5-7, 2007, available at http://mstconf.com/Polyimd5-abs.htm.

P. Perlin, et al., "Reduction of the energy gap pressure coefficient of GaN due to the constraining presence of the sapphire substrate," Journal of Applied Physics, vol. 85, Issue 4, American Institute of Physics, pp. 2385-2389, Feb. 15, 1999.

Flexible Flat Panel Displays, Editor Gregory P. Crawford, John Wiley & Sons, Ltd., pp. 3-55, Jun. 2005.

Kunigunde H. Cherenack, et al., "Amorphous Silicon Thin-Film Transistors made on Clear Plastic at 300° C.," Journal of the Korean Physical Society, vol. 54, Issue 1, pp. 415-420, Jan. 2009.

Rama Puligadda, et al., "High Performance Temporary Adhesives for Wafer Bonding Applications," Materials Research Society Symposium Proceedings, vol. 970, pp. 239-249, Feb. 2, 2007.

Anton Georgiev, Polymer Thin Films, "Preparation of Polyimide Thin Films by Vapour Deposition and Solid State Reactions," Editor Abbass A Hashim, ISBN:978-953-307-059-9, InTech China, http://www.intechopen.com/books/polymer-thin-films/preparationof-polyimide-thin-films-by-vapour-deposition-and-solid-state-reactions, pp. 72-92, Apr. 1, 2010.

Fengtao Lan, et al. "Vitreous joining of SiC-coated carbon/carbon composites," Materials Letters, vol. 62, Elsevier B.V., pp. 2347-2350, May 2008 (available online Dec. 15, 2007).

Book Review of "Adhesion Measurement of Films and Coatings," edited by K. L. Mittal, vol. 2, p. 294, VSP, 1995, in Polymer International, vol. 39, p. 77, 1996.

A. Hahnel, et al., "Formation and structure of reaction layers in Sic/glass and SiC/SiC composites," Composites Part A 27A, pp. 685-690, Elsevier Science Limited, 1996.

Der-Jang Liaw, et al, "Advanced polyimide materials: Syntheses, physical properties and applications," Progress in Polymer Science, vol. 37, pp. 907-974, 2012 Elsevier Ltd., journal hojmepage: www.elsevier.com/locate/ppolysci.

* cited by examiner

METHOD OF MANUFACTURING FLEXIBLE SUBSTRATE AND METHOD OF MANUFACTURING DISPLAY DEVICE USING THE SAME

CROSS-REFERENCE TO RELATED APPLICATION

This U.S. non-provisional patent application claims priority from and the benefit of Korean Patent Application No. 10-2013-0167183, filed on Dec. 30, 2013, which is hereby incorporated by reference for all purposes as if fully set forth herein.

BACKGROUND

1. Field

Exemplary embodiments of the present invention relate to a method of manufacturing a flexible substrate, and a method of manufacturing a display device using the same. More particularly, exemplary embodiments of the present invention relate to a method of manufacturing a flexible substrate on a support substrate, and a method of manufacturing a display device using the same.

2. Discussion of the Background

In recent years, a display device including a flexible substrate has been developed. The display device having the flexible substrate is curved in response to a user's demand and, thus, the display device provides improved convenience for a user in during moving or handling of the display device. A plastic substrate, e.g., a polyimide substrate having superior thermal resistance and strength, and a metal substrate are widely used as the flexible substrate.

When the display device is manufactured using the flexible substrate, a support substrate, such as a glass substrate, may be used to form the flexible substrate in order to secure a surface flatness of the flexible substrate. For instance, the flexible substrate is disposed on the support substrate, and thin film forming processes are performed on the flexible substrate to form pixels on the flexible substrate. Then, the flexible substrate on which the pixels are formed is separated from the support substrate. However, the flexible substrate may become strongly attached to the support substrate while the pixels are formed. As result, separating the flexible substrate from the support substrate may be difficult.

The above information disclosed in this Background section is only for enhancement of understanding of the background of the invention and therefore it may contain information that does not constitute the prior art.

SUMMARY

Exemplary embodiments of the present invention provide a method of manufacturing a flexible substrate.

Exemplary embodiments of the present invention provide a method of manufacturing a display device using the manufacturing method of the flexible substrate.

Additional aspects will be set forth in part in the description which follows and, in part, will be apparent from the description, or may be learned by practice of the invention.

An exemplary embodiment of the present invention discloses a method of manufacturing a flexible substrate, including forming a sacrificial layer on a support substrate, and then forming a flexible substrate on the sacrificial layer. Then, the sacrificial layer is heated using microwave energy to generate a gas from the sacrificial layer. The flexible substrate is then separated from the support substrate, on which the sacrificial layer is formed, using the gas.

An exemplary embodiment of the present invention also discloses a method of manufacturing a flexible substrate, including forming a sacrificial layer on a support substrate, and then forming a flexible substrate on the sacrificial layer. Then, pixels are formed on the flexible substrate, and the sacrificial layer is heated using microwave energy to generate a gas from the sacrificial layer. The flexible substrate, including the pixels formed thereon, is then separated from the support substrate, on which the sacrificial layer is formed, using the gas.

The support substrate is a glass substrate, the flexible substrate is a polyimide substrate, and the sacrificial layer comprises a silicon carbide bonded with hydrogen.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, like reference numerals denote like elements, and the sizes and thicknesses of layers and regions may be exaggerated for clarity.

It will be understood that when an element or layer is referred to as being "on", "connected to", or "coupled to" another element or layer, it can be directly on, connected to, or coupled to the other element or layer, or intervening elements or layers may be present. In contrast, when an element is referred to as being "directly on," "directly connected to", or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ). As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
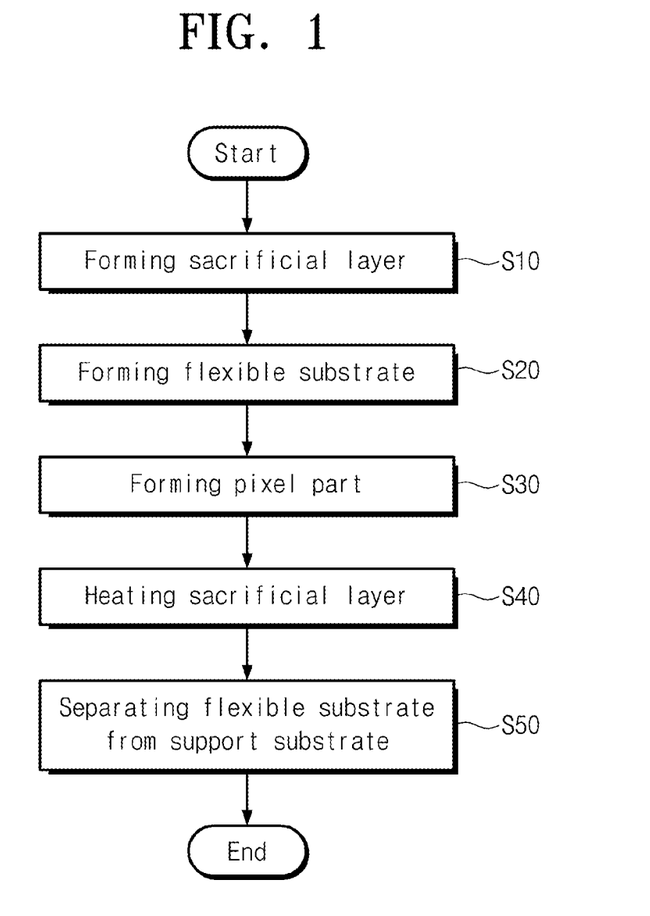
FIG. 1 is a flowchart showing a manufacturing method of a display device according to an exemplary embodiment of the present invention.

Referring to FIG. 1, a sacrificial layer containing silicon carbide (SiC) bonded with hydrogen (hydrogenated silicon carbide) is formed on a support substrate (S10). The support substrate may be, for example, a glass substrate. In addition, the sacrificial layer may be formed by a chemical vapor deposition method using a source gas containing silane ($SiH_4$) and methane ($CH_4$).

A flexible substrate is then formed on the sacrificial layer (S20). The flexible substrate may be, for example, a polyimide substrate. The polyimide substrate is formed by providing polyamic acid (PAA) on the sacrificial layer as a precursor of polyimide, and then curing the polyamic acid.

A pixel part including pixels is then formed on the flexible substrate formed on the support substrate (S30). When the display device is an organic electroluminescent display device, each of the pixels includes an anode, a cathode, and an organic light emitting layer interposed between the anode and the cathode. On the other hand, when the display device is a liquid crystal display device, each of the pixels includes a pixel electrode, an opposite electrode, and a liquid crystal layer interposed between the pixel electrode and the opposite substrate.

Then, the sacrificial layer is heated using microwave to vaporize the hydrogen in the sacrificial layer (S40). The microwaves generally have a frequency of about 8 GHz to about 16 GHz, and the sacrificial layer is heated at a temperature of about 400° C. to about 500° C. by controlling a time during which the microwave energy is radiated onto the sacrificial layer.

When the sacrificial layer is heated at a temperature of about 400° C. to about 500° C., the hydrogen contained in the sacrificial layer is vaporized, and a gas is discharged from the sacrificial layer. More specifically, when the sacrificial layer is heated, a dehydrogenation occurs in the sacrificial layer, and the hydrogen is stripped from the silicon carbide contained in the sacrificial layer and released as a vapor. Therefore, the gas is discharged from the sacrificial layer.

Then, the flexible substrate, including the pixel part formed thereon, is separated from the support substrate using the gas (S50). In more detail, a bonding strength between the flexible substrate and the sacrificial layer is reduced as a result of the gas discharged from the sacrificial layer. Thus, the flexible substrate, including the pixel part formed thereon, may be easily separated from the support substrate, resulting in the manufacture of the display device including the flexible substrate and the pixel part.

FIGS. 2A to 2G are views showing the manufacturing method of the display device.

Figure 2A:
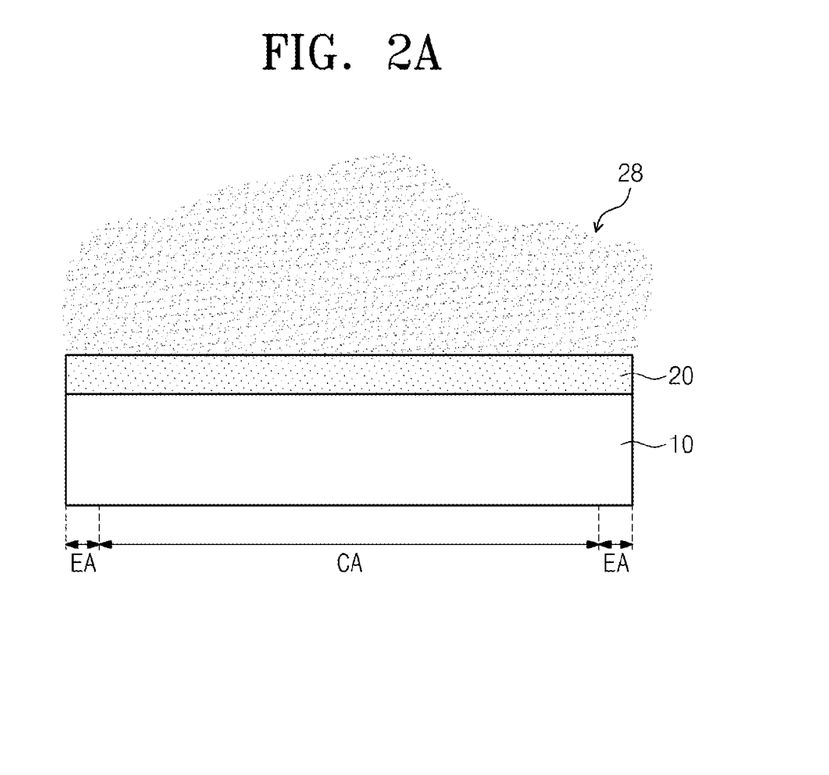
FIGS. 2A, 2B, 2C, 2D, 2E, 2F, and 2G are views showing a manufacturing method of a display device according to an exemplary embodiment of the present invention.

Referring to FIG. 2A, a support substrate 10 is prepared, in which a cell area CA and an edge area EA disposed outside the cell area CA are defined. The support substrate 10 may be, for example, a glass substrate or a rigid substrate, e.g., a wafer.

A preliminary sacrificial layer 20 is formed on the support substrate 10 to correspond to the cell area CA and the edge area EA.

The preliminary sacrificial layer 20 may be formed of an inorganic material that absorbs the microwave energy. In an exemplary embodiment, the hydrogenated silicon carbide of the preliminary sacrificial layer 20 is heated by absorbing the microwave energy.

In the present exemplary embodiment, the preliminary sacrificial layer 20 is formed by the chemical vapor deposition (CVD) method. When the preliminary sacrificial layer 20 is formed of hydrogenated silicon carbide, the source gas 28 used in the chemical vapor deposition may include silane ($SiH_4$) and methane ($CH_4$).

In an exemplary embodiment, a weight percent (wt %) of the hydrogen in the preliminary sacrificial layer 20 is in a range from about 1 wt % to about 50 wt %. When the weight percent of the hydrogen in the preliminary sacrificial layer 20 is less than about 1 wt %, an amount of the gas GS (refer to FIG. 2F) discharged from the preliminary sacrificial layer 20 may be reduced. In addition, when the weight percent of the hydrogen in the preliminary sacrificial layer 20 exceeds about 50 wt %, a weight percent of the silicon carbide contained in the preliminary sacrificial layer 20 becomes smaller. Accordingly, these situations result in a deterioration in the absorbance of the sacrificial layer with respect to the energy of the microwave MW (refer to FIG. 2F), and thus, a time required to heat the sacrificial layer is increased.

Figure 2B:
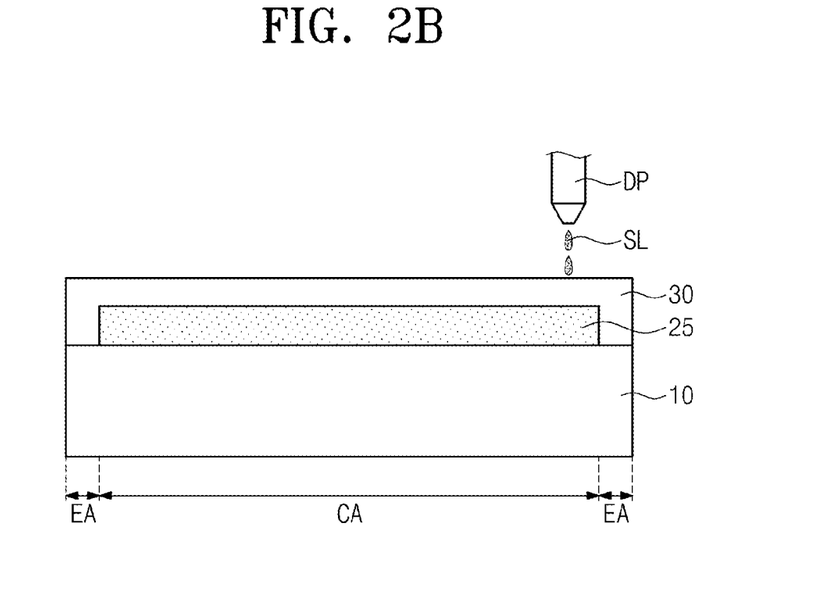
Figure 2C:
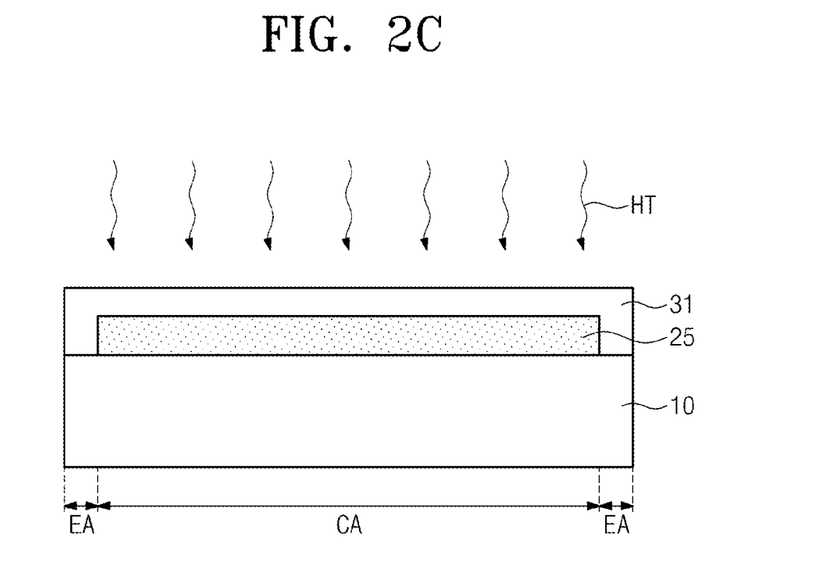

Referring to FIGS. 2B and 2C, a portion of the preliminary sacrificial layer 20 (refer to FIG. 2A), which corresponds to the edge area EA, is removed to form the sacrificial layer 25. Because the preliminary sacrificial layer 20 is patterned to form the sacrificial layer 25, the sacrificial layer 25 includes the same material as that of the preliminary sacrificial layer.

In an exemplary embodiment, the sacrificial layer 25 may have, for example, a thickness of about 1 micrometer to about 30 micrometers. The sacrificial layer 25 is used to lower the bonding strength between the flexible substrate 35 (refer to FIG. 2G) and the support substrate 10 (refer to FIG. 2G), and thus, the thickness of the sacrificial layer 25 may be increased as thickness, size, or weight of the flexible substrate is increased.

Then, a source solution SL is provided to the cell area CA and the edge area EA using a spray unit DP. As a result, a first preliminary substrate 30 is formed on the support substrate 30 and covers the sacrificial layer 25.

In an exemplary embodiment, the source solution SL may include polyamic acid (PAA) and a solvent. The source solution SL may be provided to the support substrate 10 using a slit coating device or a spin coating device, which includes the spray unit DP.

Heat HT is provided to the first preliminary substrate 30 to remove the solvent from the preliminary substrate 30. Thus, the first preliminary substrate 30 is cured to form a second preliminary substrate 31.

Figure 2D:
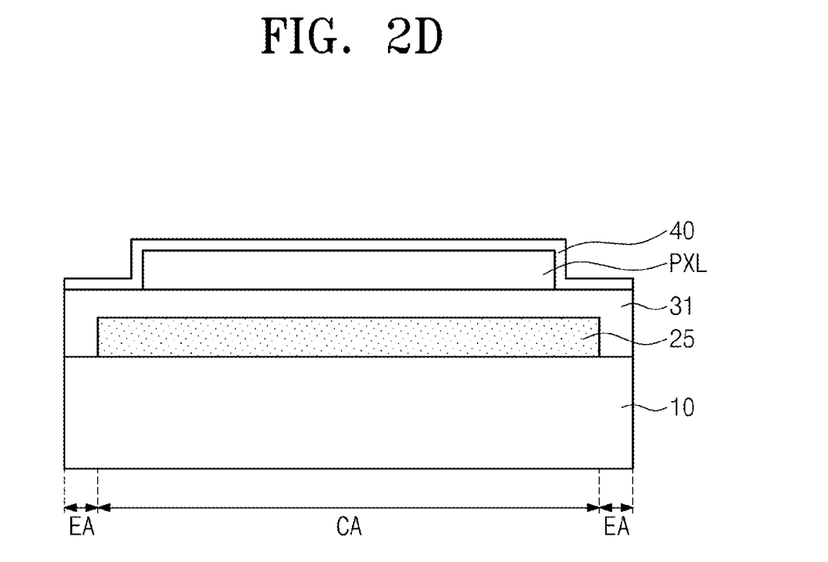

Referring to FIG. 2D, a pixel part PXL is formed on the second preliminary substrate 31, and a sealing layer 40 is formed to cover the pixel part PXL. In more detail, the pixel part PXL is formed on the second preliminary substrate 31 to correspond to the cell area CA. The sealing layer 40 is formed on the pixel part PXL and the second preliminary substrate 31 to correspond to the cell area CA and the edge area EA. That is, because the sealing layer 40 covers the pixel part PXL in the cell area CA and covers a side portion of the pixel PXL in the edge area EA, the pixel part PXL is sealed by the sealing layer 40.

In an exemplary embodiment, the pixel part PXL includes pixels, where each of the pixels includes the anode, the cathode, and the organic light emitting layer interposed between the anode and the cathode (not shown). According to another exemplary embodiment, each of the pixels may include the pixel electrode, the opposite electrode, and the liquid crystal layer interposed between the pixel electrode and the opposite electrode (all not shown). In this case, the opposite substrate may be provided instead of the sealing layer 40, and the opposite substrate may be coupled to the second preliminary substrate 31 by a sealant (not shown) formed in the edge area EA.

Figure 2E:
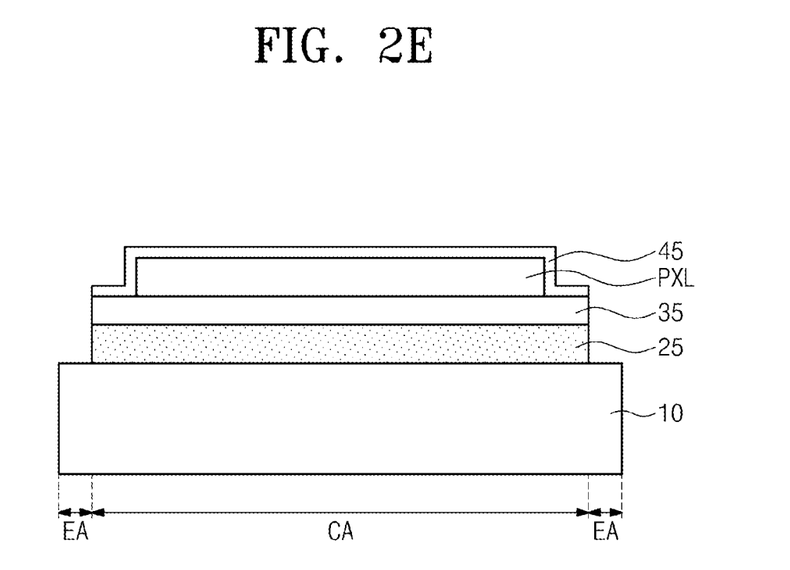

Referring to FIGS. 2D and 2E, a portion of the second preliminary substrate 31, which corresponds to the edge area EA, is removed to form the flexible substrate 35. A portion of the sealing layer 40 corresponding to the edge area EA is removed to form a sealing part 45.

Because the side portion of the sacrificial layer 25 may be exposed in the edge area EA before the sacrificial layer 25 is heated using the microwave, the gas GS (refer to FIG. 2F) generated while the sacrificial layer 25 is heated may be discharged to the outside of the sacrificial layer 25.

Figure 2F:
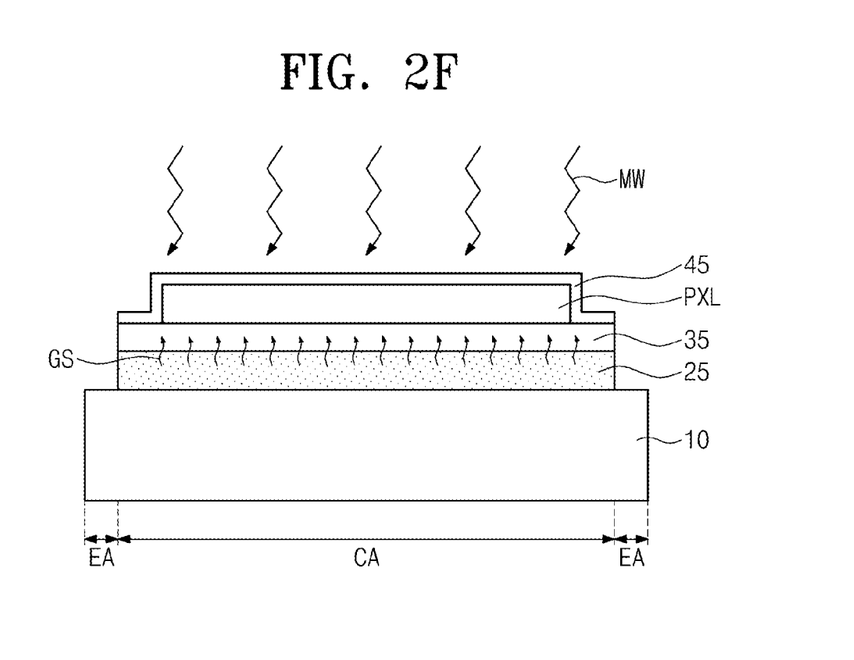
Figure 2G:
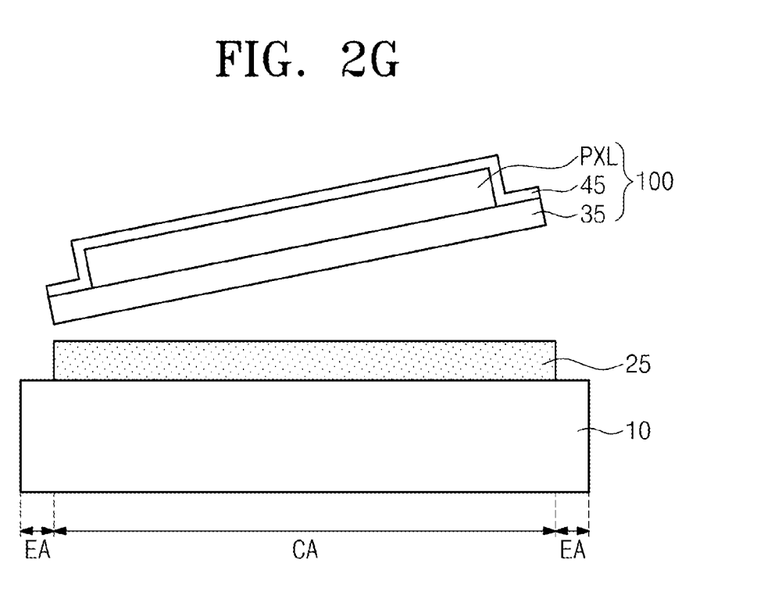

Referring to FIGS. 2F and 2G, the sacrificial layer 25 is heated by the microwave energy MW. When the support substrate 10 is a glass substrate, the flexible substrate 35 may be a polyimide substrate, and the sacrificial layer 25 may include hydrogenated silicon, such that an amount of microwave energy MW, which is absorbed by the sacrificial layer 25, is greater than an amount of microwave energy MW, which is absorbed by each of the support substrate 10 and the flexible substrate 35. Accordingly, during microwave energy MW upon the sacrificial layer 25, the sacrificial layer 25 may be selectively heated from among the support substrate 10, the flexible substrate 35, and the sacrificial layer 25.

In an exemplary embodiment, the radiation time of the microwave energy MW onto the sacrificial layer 25 may be controlled such that the sacrificial layer 25 is heated at a temperature of about 400° C. to about 500° C.

When the sacrificial layer 25 is heated by the microwave energy MW, dehydrogenation occurs in the sacrificial layer 25 and vaporized hydrogen is released as the gas GS. Therefore, the gas GS is discharged from the sacrificial layer 25. Thus, the bonding strength between the flexible substrate 35 and the sacrificial layer 25 is reduced by the gas GS, so that the flexible substrate 25 including the pixel part PXL formed thereon is easily separated from the support substrate 10, thereby completing the display device 100 including the flexible substrate 35 and the pixel part PXL.

In addition, a portion of the gas GS is discharged to the outside since the side portion of the sacrificial layer 25 is exposed to the outside while the sacrificial layer 25 is heated. Accordingly, the gas GS may be prevented from being entrapped between the flexible substrate 35 and the sacrificial layer 25, and pressurization of the pixel part PXL by the gas GS may be prevented.

Figure 3:
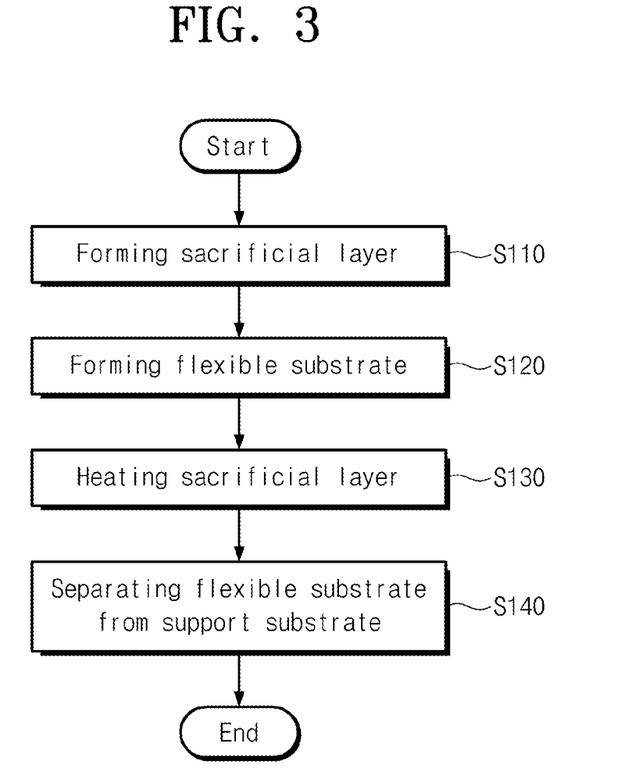
FIG. 3 is a flowchart showing a manufacturing method of a flexible substrate according to an exemplary embodiment of the present invention.

FIG. 3 is a flowchart showing a manufacturing method of a flexible substrate according to another exemplary embodiment of the present invention.

Referring to FIG. 3, a sacrificial layer containing hydrogenated silicon carbide (SiC) is formed on a support substrate (S110).

In the present exemplary embodiment, the support substrate may be, for example, a glass substrate. In addition, the sacrificial layer may be formed by a chemical vapor deposition method using a source gas containing silane ($SiH_4$) and methane ($CH_4$).

Then, a flexible substrate is formed on the sacrificial layer (S120). In the present exemplary embodiment, the flexible substrate may be, for example, a polyimide substrate. The polyimide substrate may be formed by providing polyamic acid (PAA) on the sacrificial layer as a precursor of polyimide, and curing the polyamic acid.

Then, the sacrificial layer is heated using microwave energy to vaporize the hydrogen in the sacrificial layer (S130). The microwaves have a frequency of about 8 GHz to about 16 GHz, and the sacrificial layer is heated at a temperature of about 400° C. to about 500° C. by controlling radiation time of the microwave energy upon the sacrificial layer.

When the sacrificial layer is heated at the temperature of about 400° C. to about 500° C., the hydrogen contained in the sacrificial layer is vaporized, and a gas is discharged from the sacrificial layer. In more detail, when the sacrificial layer is heated, a dehydrogenation occurs in the sacrificial layer and the hydrogen stripped from the silicon carbide contained in the sacrificial layer is vaporized. Therefore, the gas is discharged from the sacrificial layer.

Then, the flexible substrate is separated from the support substrate using the gas (S140). In more detail, a bonding strength between the flexible substrate and the sacrificial layer is reduced as a result of the gas discharged from the sacrificial layer, and thus, the flexible substrate may be easily separated from the support substrate. As a result, the flexible substrate may be manufactured.

According to the above, the sacrificial layer is formed between the support substrate and the flexible substrate, and the flexible substrate is easily separated from the support substrate using the gas discharged from the sacrificial layer heated by the microwave. Therefore, a process of radiating a laser beam to an interface between the flexible substrate and the sacrificial layer may be omitted and, thus, the cost and time required to manufacture the display device may be reduced.

In addition, the sacrificial layer includes silicon carbide that absorbs the energy of the microwave. Thus, although the microwave is radiated to the structure in which the support substrate, the sacrificial layer, and the flexible substrate are sequentially stacked one on another, the sacrificial layer may be selectively heated by the microwave.

It will be apparent to those skilled in the art that various modifications and variations can be made in the present invention without departing from the spirit and scope of the present invention as defined by the following claims. Thus, it is intended that the present invention cover the modifications and variations of this invention provided they come within the scope of the appended claims and their equivalents.

What is claimed is:

1. A method of manufacturing a display device, comprising:
   forming a sacrificial layer on a support substrate;
   forming a flexible substrate on the sacrificial layer;
   forming pixels on the flexible substrate;
   heating the sacrificial layer using microwave energy to generate a gas from the sacrificial layer, and thereby weakening a bonding between the flexible substrate and the sacrificial layer; and
   separating the flexible substrate from the support substrate using the gas.

2. The method of claim 1, wherein the sacrificial layer comprises an inorganic material.

3. The method of claim 2, wherein:
   the support substrate comprises a glass substrate;
   the flexible substrate comprises a polyimide substrate; and
   the sacrificial layer comprises hydrogenated silicon carbide.

4. The method of claim 3, wherein, during heating of the sacrificial layer, the sacrificial layer absorbs more microwave energy than does each of the support substrate and the flexible substrate.

5. The method of claim 3, wherein the gas is generated by vaporizing the hydrogen contained in the sacrificial layer while the sacrificial layer is heated.

6. The method of claim 5, wherein the sacrificial layer is heated at a temperature of about 400° C. to about 500° C.

7. The method of claim 3, wherein the sacrificial layer is formed by a chemical vapor deposition.

8. The method of claim 7, wherein the chemical vapor deposition is performed using a source gas comprising silane ($SiH_4$) and methane ($CH_4$).

9. The method of claim 8, wherein a weight percent of the hydrogen in the sacrificial layer is in a range from about 1 wt % to about 50 wt %, and the weight percent of the hydrogen is controlled by controlling a concentration of the methane contained in the source gas.

10. The method of claim 1, wherein the forming of the flexible substrate comprises:
    applying a source solution comprising polyamic acid to the sacrificial layer; and
    curing the source solution applied to the sacrificial layer.

11. The method of claim 1, wherein the forming of the sacrificial layer comprises:
    forming a preliminary sacrificial layer on a cell area of the support substrate and an edge area of the support substrate disposed outside the cell area; and
    removing a portion of the preliminary sacrificial layer disposed on the edge area.

12. The method of claim 11, wherein the flexible substrate is formed on the cell area and the edge area and covers the sacrificial layer.

13. The method of claim 12, further comprising removing a portion of the flexible substrate disposed on the edge area, to expose the portion of the sacrificial layer before the sacrificial layer is heated.

14. A method of manufacturing a flexible substrate, comprising:
    forming a sacrificial layer on a support substrate;
    forming a flexible substrate on the sacrificial layer;
    heating the sacrificial layer using microwave energy to generate a gas from the sacrificial layer; and
    separating the flexible substrate from the support substrate.

15. The method of claim 14, wherein the sacrificial layer comprises an inorganic material to absorb energy of the microwave energy.

16. The method of claim 15, wherein:
    the support substrate comprises a glass substrate;
    the flexible substrate comprises a polyimide substrate; and
    the sacrificial layer comprises hydrogenated silicon carbide.

17. The method of claim 16, wherein, during heating of the sacrificial layer, the sacrificial layer absorbs more microwave energy than does each of the support substrate and the flexible substrate.

18. The method of claim 16, wherein, during heating of the sacrificial layer, the gas is generated by vaporizing the hydrogen contained in the sacrificial layer.

19. The method of claim 16, wherein the sacrificial layer is formed by a chemical vapor deposition using a source gas comprising silane ($SiH_4$) and methane ($CH_4$).

20. The method of claim 14, wherein the forming of the flexible substrate comprises:
    applying a source solution comprising polyamic acid to the sacrificial layer; and
    curing the source solution applied to the sacrificial layer.

* * * * *